United States Patent [19]

Walthall et al.

[11] 4,305,006
[45] Dec. 8, 1981

[54] ELECTRICAL SWITCH

[76] Inventors: Michael S. Walthall, 100 Shadow Oak Ct., Burleson, Tex. 76028; Marshall A. Sherwin, Jr., 1151 Katrina Ct., Fort Worth, Tex. 76114

[21] Appl. No.: 112,200
[22] Filed: Jan. 15, 1980

Related U.S. Application Data

[63] Continuation-in-part of Ser. No. 955,967, Oct. 30, 1978, abandoned.

[51] Int. Cl.³ .................. H05B 37/00; H03K 17/945
[52] U.S. Cl. ...................................... 307/38; 307/115; 307/117; 315/156; 315/194; 250/221
[58] Field of Search ............... 307/117, 115, 140, 139, 307/38, 142, 143; 315/155, 156, 158, 159, 194, 154, 153; 250/214 R, 214 D, 214 SW, 221-224; 179/1 SW; 340/147 R; 361/173, 191

[56] References Cited

U.S. PATENT DOCUMENTS

| | | | |
|---|---|---|---|
| 3,680,047 | 7/1972 | Perlman | 307/117 |
| 3,946,241 | 3/1976 | Malinowski | 250/214 R |
| 3,967,111 | 6/1976 | Brown | 250/214 R |
| 4,087,702 | 5/1978 | Kirby | 315/194 |
| 4,150,415 | 4/1979 | Fichtner | 307/140 |
| 4,153,860 | 5/1979 | Vonick | 307/117 |

Primary Examiner—L. T. Hix
Assistant Examiner—Stafford D. Schreyer
Attorney, Agent, or Firm—Arthur F. Zobal

[57] ABSTRACT

An on-off switch and a dimmer for an electrical load such as an electric light. The on-off switch comprises a source and detector of infra-red radiation for controlling on-off circuitry and a load switch. The on-off switch is activated by passing one's hand close to and in front of the source and detector. This action activates the on-off circuitry to control the load switch to turn the light on. A second pass of the hand turns the light off. A second source and detector of infra-red radiation and dimmer circuitry are provided for dimming purposes. Dimming action is achieved by placing one's hand close to and in front of the second source and detector to activate the dimmer circuitry to sequentially control the load switch to change the brightness level of the light. The dimming sequence is stopped when the desired brightness level is reached by moving the hand away from the second source and detector. Touching of the switch case is not required to activate the switch for on-off purposes or for dimming purposes.

In another embodiment, two sources and a common detector are employed as part of two on-off switches for allowing independent control of two loads. In a further embodiment, two sources and a common detector are employed as part of an on-off and dimmer switch for controlling a single load.

27 Claims, 13 Drawing Figures

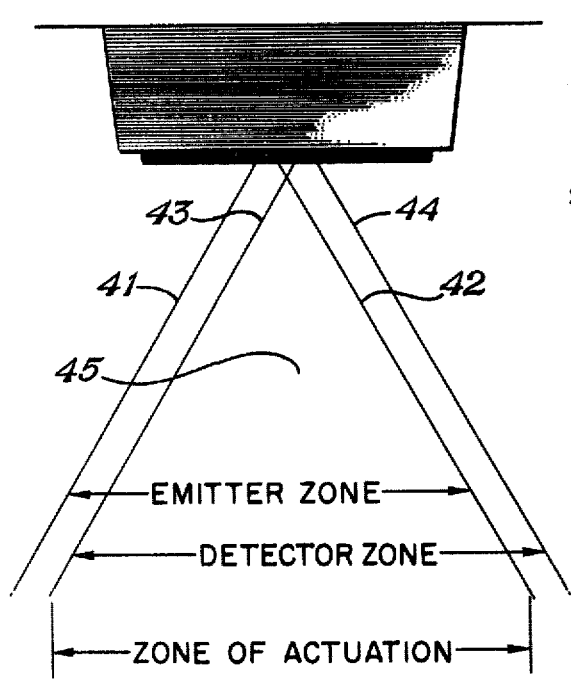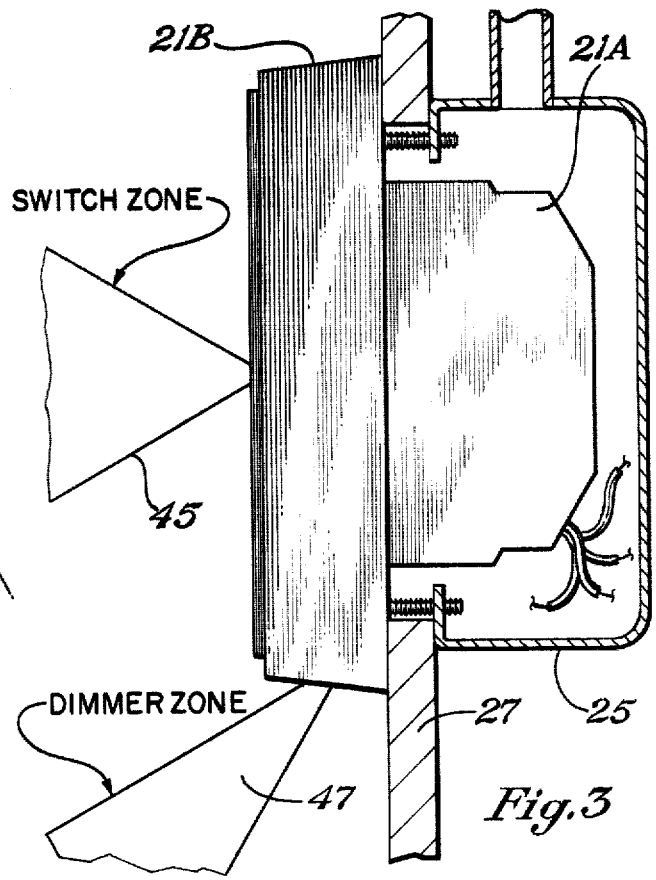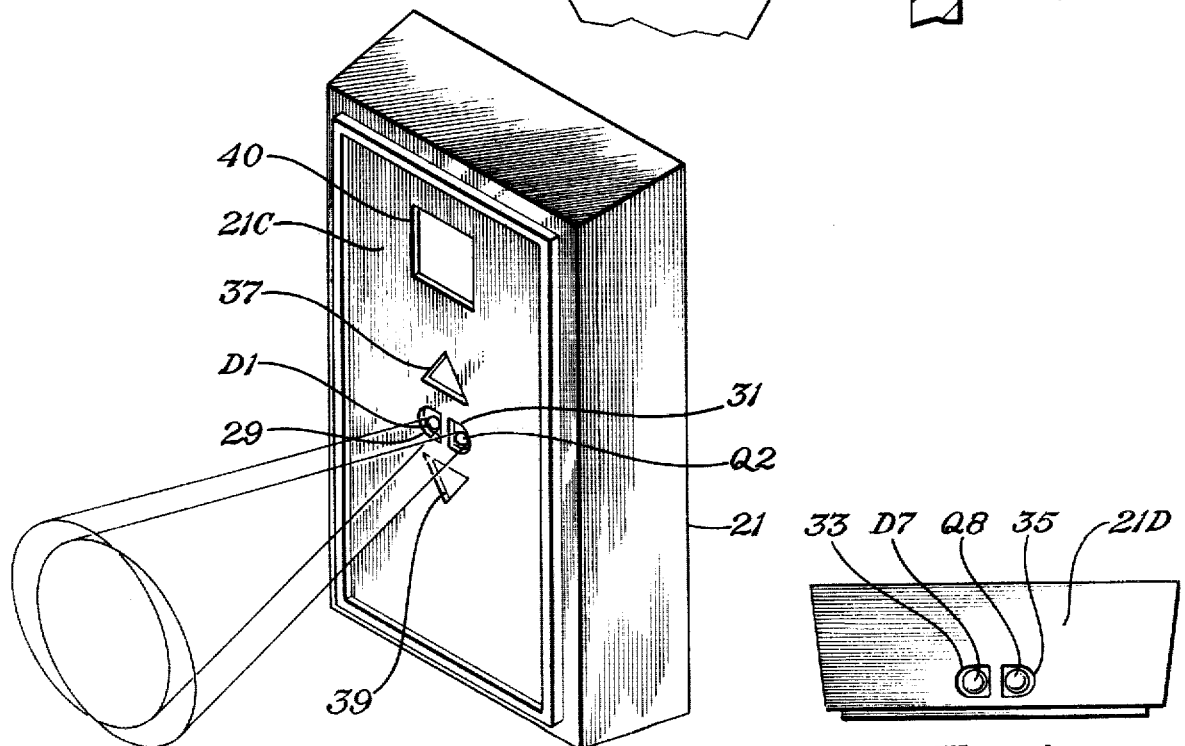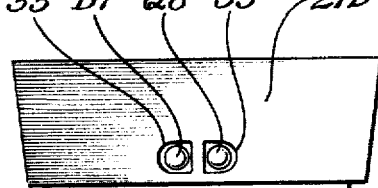

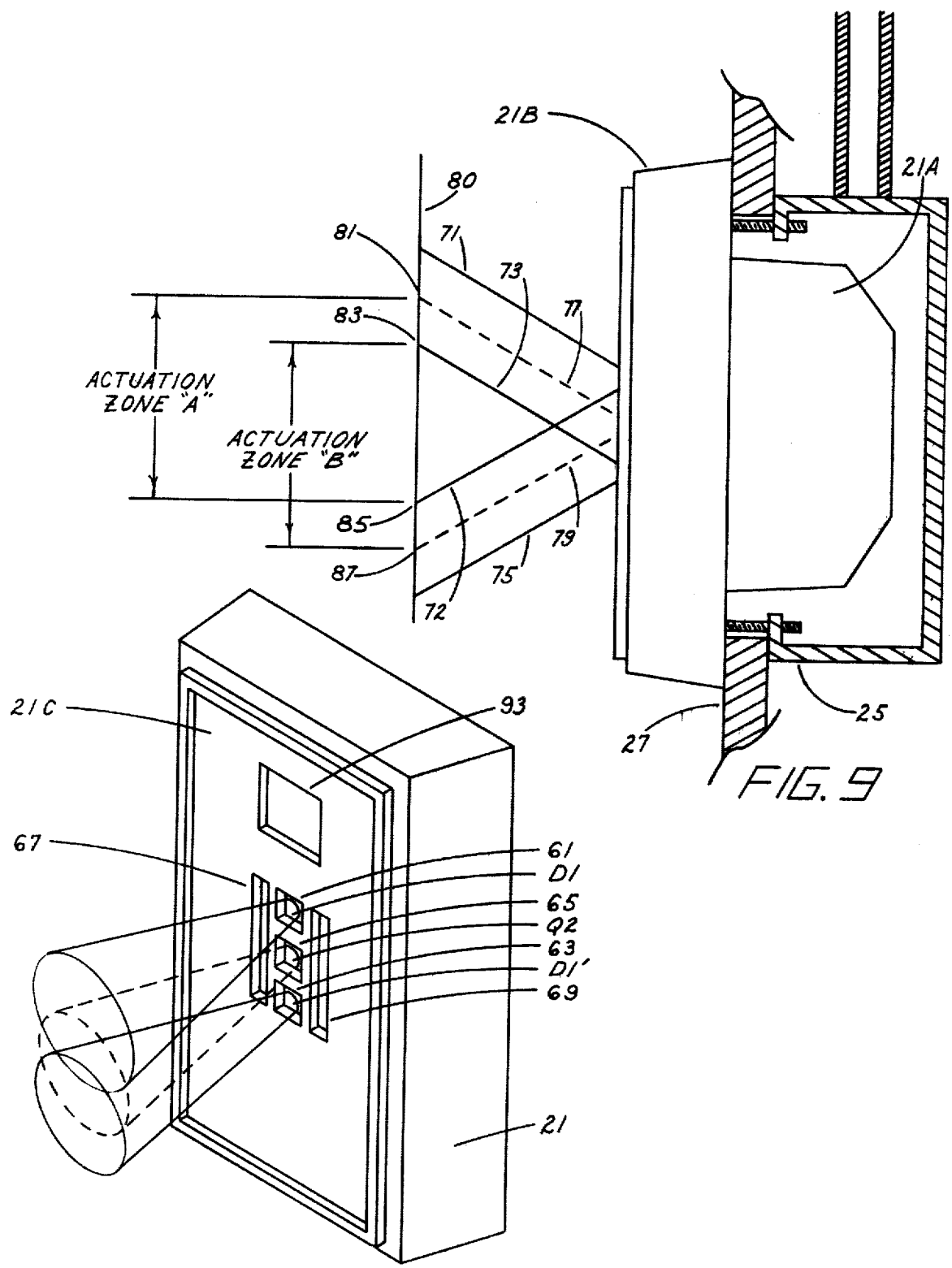

ELECTRICAL SWITCH

This application is a Continuation-in-Part of U.S. patent application Ser. No. 955,967 filed Oct. 30, 1978, now abandoned.

SUMMARY OF THE INVENTION

It is an object of the present invention to provide an on-off switch comprising a source and detector of electromagnetic radiation or energy for controlling a load such as an electric light without the requirement of touching the switch. The switch is activated by passing an object such as one's hand close to and in front of the source and detector. The detector detects electromagnetic radiation from the source reflected by the hand and produces an output. On-off circuitry is provided which is actuated by the detector output to control a load switch to allow electric power to be fed to the load. After the hand is removed, the on-off circuitry causes the load switch to maintain power flow to the load. A second pass of the hand activates the on-off circuitry to cause the load switch to terminate the flow of power to the load.

It is a further object of the present invention to provide a second source and detector of electromagnetic radiation to vary the amount of power applied to the load, for dimming purposes, if the load is an electric light. The second source and detector are located to face in a direction different from that of the on-off source and detector. Dimming action is achieved by placing an object such as one's hand close to and in front of the second source and detector. The second detector detects electromagnetic radiation from the second source reflected from the hand and produces an output. Dimmer circuitry is provided which is activated by the output of the second detector to produce a sequence of signals for sequentially causing the load switch to vary the amount of power fed to the load. The dimming sequence is stopped when the desired brightness level is reached by moving the hand away from the second source and detector. The dimming action is achieved without the requirement of touching the switch housing.

Another subject of the present invention is to provide two on/off switches comprising two separate sources of electromagnetic radiation with a common detector located between the two sources for independently controlling two separate loads (such as electric lights) without the requirement of touching either switch. One switch circuit is actuated by passing the hand (or other object) close to and in front of the sources and detector in a given direction only (i.e. downward) while the other switch circuit is actuated by passing the hand close to and in front of the sources and detector from the opposite direction only (i.e. upward).

In another aspect, the use of two sources and a common detector may be employed to actuate on-off or dimmer circuitry for controlling a single load. The on-off circuitry is actuated by passing the hand close to and in front of the sources and detector in a given direction while the dimmer circuitry is actuated by moving the hand in front of the sources and detector from an opposite direction and holding it in a given position for a desired time to achieve the desired dimming effect.

BRIEF DESCRIPTION OF THE DRAWINGS

FIG. 1 is a perspective view of the front of the switch housing in which the switch of the present invention is located.

FIG. 2 is a top view of a portion of the switch housing of FIG. 1.

FIG. 3 is a side view of the switch housing of FIG. 1 located in the conventional electric switch box shown in cross-section.

FIG. 4 is a bottom view of a portion of the switch housing of FIG. 1.

FIG. 8 is a perspective view of the front of the switch housing in which a switch means having two sources and a common detector is located for controlling two separate loads.

FIG. 9 is a side view of the switch housing of FIG. 8 located in a conventional electric switch box shown in cross-section.

DETAILED DESCRIPTION OF THE PREFERRED EMBODIMENTS

Figure 5:
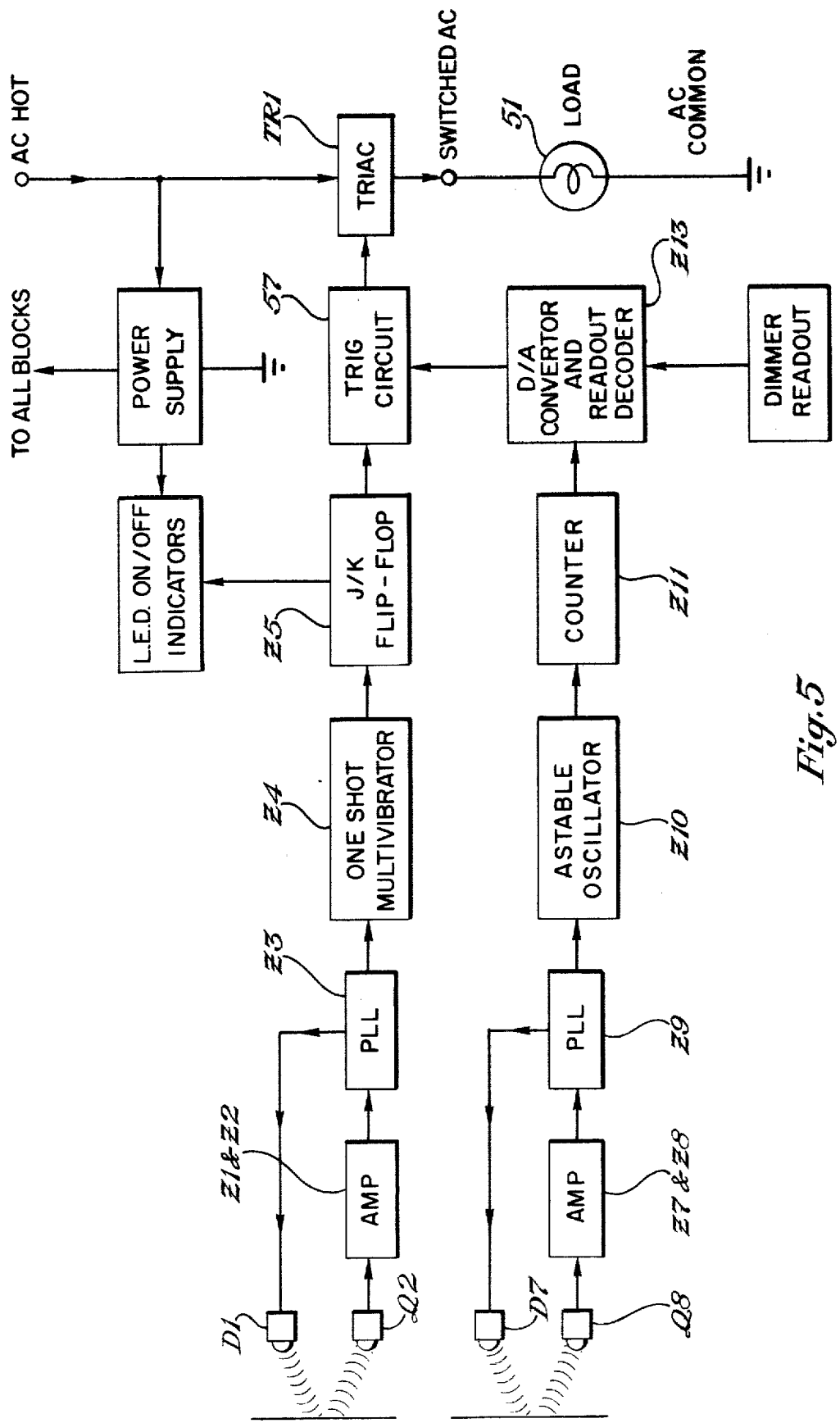
FIG. 5 is a block diagram of the electrical circuitry of the switch of the present invention.

Referring to FIGS. 1-4 of the drawings, reference numeral 21 identifies the housing in which the switch of the present invention is supported. The switch comprises an on-off system and a dimming system. The on-off system comprises an emitter D1 and detector Q2 of infra-red radiation for on-off purposes which are coupled to on-off circuitry which controls a load switch disclosed in FIG. 5 and in FIG. 6A. The dimming system comprises an emitter D7 and detector Q8 of infrared radiation for dimming purposes and which are coupled to dimmer circuitry which also controls the load switch. The rear portion 21A of the housing 21 is of a size such that it may fit in a conventional electric switch box 25 with the rear of the front portion 21B of the housing 21 abutted against a wall 27 of a house or building. The housing 21 is secured in place by means not shown.

The emitter D1 and detector Q2 are supported to face forward through windows 29 and 31 formed through the front wall 21C of the housing 21. The emitter D7 and detector Q8 are supported to face downward and outward from the wall through windows 33 and 35 formed through the lower wall 21D of the front portion of the housing 21. Windows 37 and 39 are employed for viewing on-off indicators, respectively, and window 40 is employed for viewing dimmer indicators. The on-off indicators are identified at D4 and D5 in FIG. 6A and the dimmer indicators are identified at D12, D13, D14 and D15 in FIG. 6B.

The emitters D1 and D7 preferably are focused emitters and the detectors Q2 and Q8 preferably are focused detectors. In operation, emitter D1 emits a beam of infra-red radiation which fans out as depicted by lines 41 and 42 in FIG. 2. The field of view of the detector Q2 is indicated by lines 43 and 44 and overlaps the emitter beam. The overlapped area is defined as a zone of actuation and is identified at 45. The emitter D7 and detector Q8 are positioned to operate in the same manner and their zone of actuation is identified at 47 in FIG. 3.

The emitter D1 and detector Q2 are coupled to on-off circuitry for controlling a load switch for turning a load on or off. Emitter D7 and detector Q8 are coupled to dimmer circuitry for controlling the load switch for varying the amount of power applied to the load. The load may be any type of electric load which can be controlled by the load switch such as an electric light bulb or certain types of electric motors.

In the following example, the load is defined as an electric bulb which is identified at 51 in FIG. 6A. Assume that the light bulb is off. One may turn the light on by passing one's hand (or other object) within about three or four inches directly in front of the emitter D1 and detector Q2 through the zone of actuation 45. This action activates the on-off circuitry to actuate the load switch to turn the light on. A second pass of the hand turns the light off. It is not necessary to touch the housing 21 to operate the on-off circuitry to turn the light on or off. The on-off circuitry has a built in time delay to prevent accidental multiple triggering of the switch. On-off indicators D4 and D5 are light emitting diodes which produce green and red light respectively when actuated. L.E.D., D4 is actuated when the switch is in the "On" state and the light 51 is on. L.E.D., D5 is actuated when the switch is in the "Off" state and the light 51 is off. The red light also serves as a night light for easy location of the switch in the dark.

The dimmer circuitry is independent of the on-off circuitry. This feature allows the operator to set the dimmer to any desired brightness level even before the light is turned on. Dimmer indicators D12, D13, D14 and D15 are light emitting diodes which allow the operator to instantly determine the exact level at which the dimmer is set.

The dimmer circuitry is activated by placing the hand (or other object) within approximately three to four inches directly in front of the emitter D7 and detector Q8 within the actuation zone 47. As seen in FIG. 3, this zone is away from the switch zone 45 and is below and slightly in front of the housing 21. This action actuates the dimmer circuitry which controls the load switch and changes the brightness level of the light bulb at approximately one second intervals. The dimming sequence is stopped when the desired brightness level is reached by simply moving the hand away from the emitter D7 and detector Q8. The sequence is continued if the hand is again placed in close proximity to the emitter D7 and detector Q8. The dimming sequence is bi-directional, that is it automatically reverses itself when its upper and lower levels are reached unless the sequence is stopped. As with the on-off switch, it is not necessary to actually touch the housing 21 to operate the dimming system.

Figure 6A:
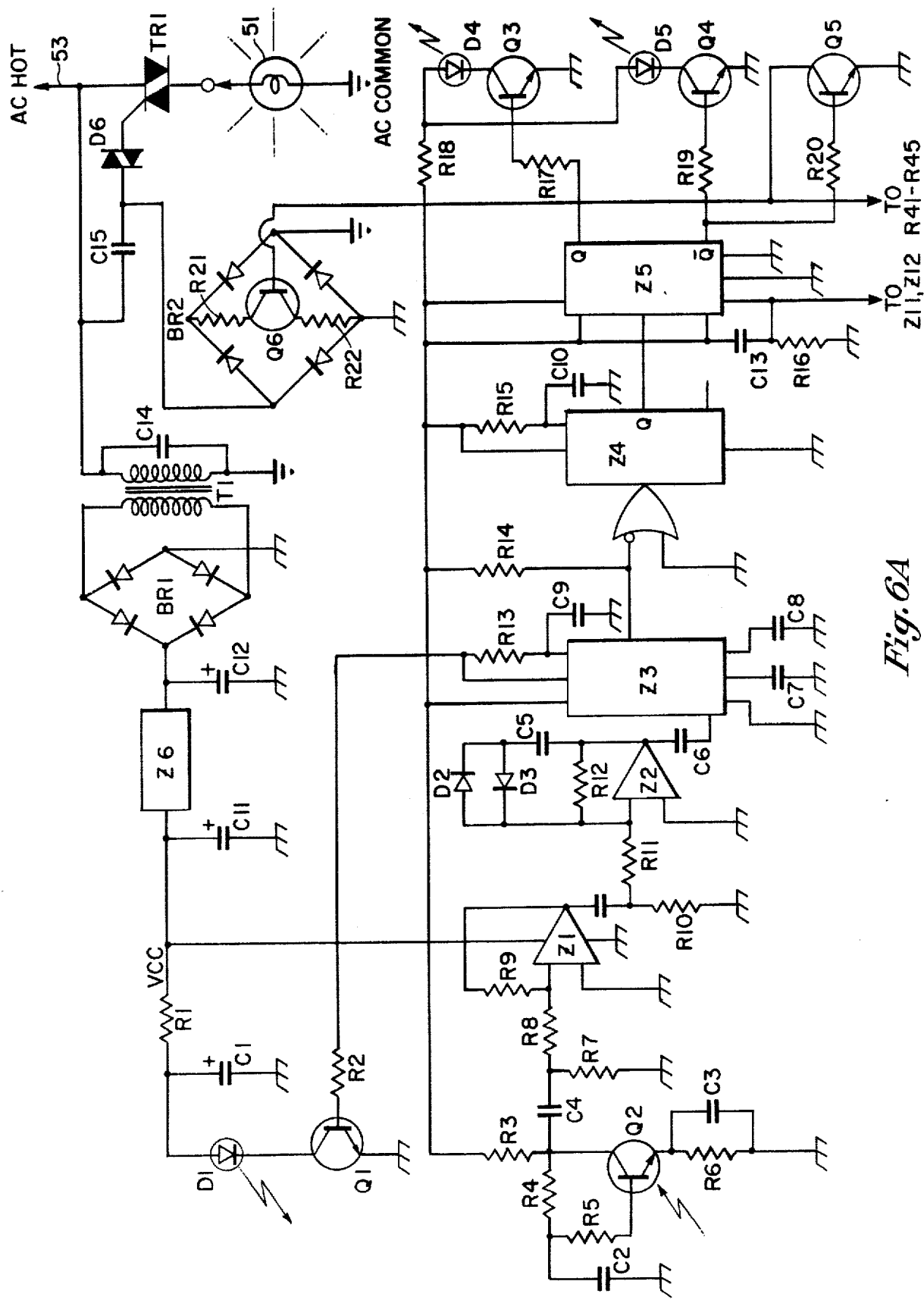
FIG. 6A and 6B are electrical schematic diagrams of the block diagram of FIG. 5. The complete electrical circuitry can be seen by placing the bottom of FIG. A adjacent the top of FIG. B.

Referring to FIGS. 5 and 6A, the circuitry for performing the on-off function comprises amplifiers Z1 and Z2, a phase lock loop Z3, a one shot multivibrator Z4, and a J/K flip-flop Z5. The load switch comprises a Triac which is identified at TR1 in FIG. 6A and diode D6. The load input to TR1 is coupled to an alternating current supply 53 and its output is coupled to load 51. Diode D6 is coupled to the trigger input of TR1. The load switch is controlled by the on-off circuitry through a trigger circuit which comprises bridge BR2, transistor Q6, resistors R21 and R22 and capacitor C15, as shown in FIG. 6A.

Figure 6B:
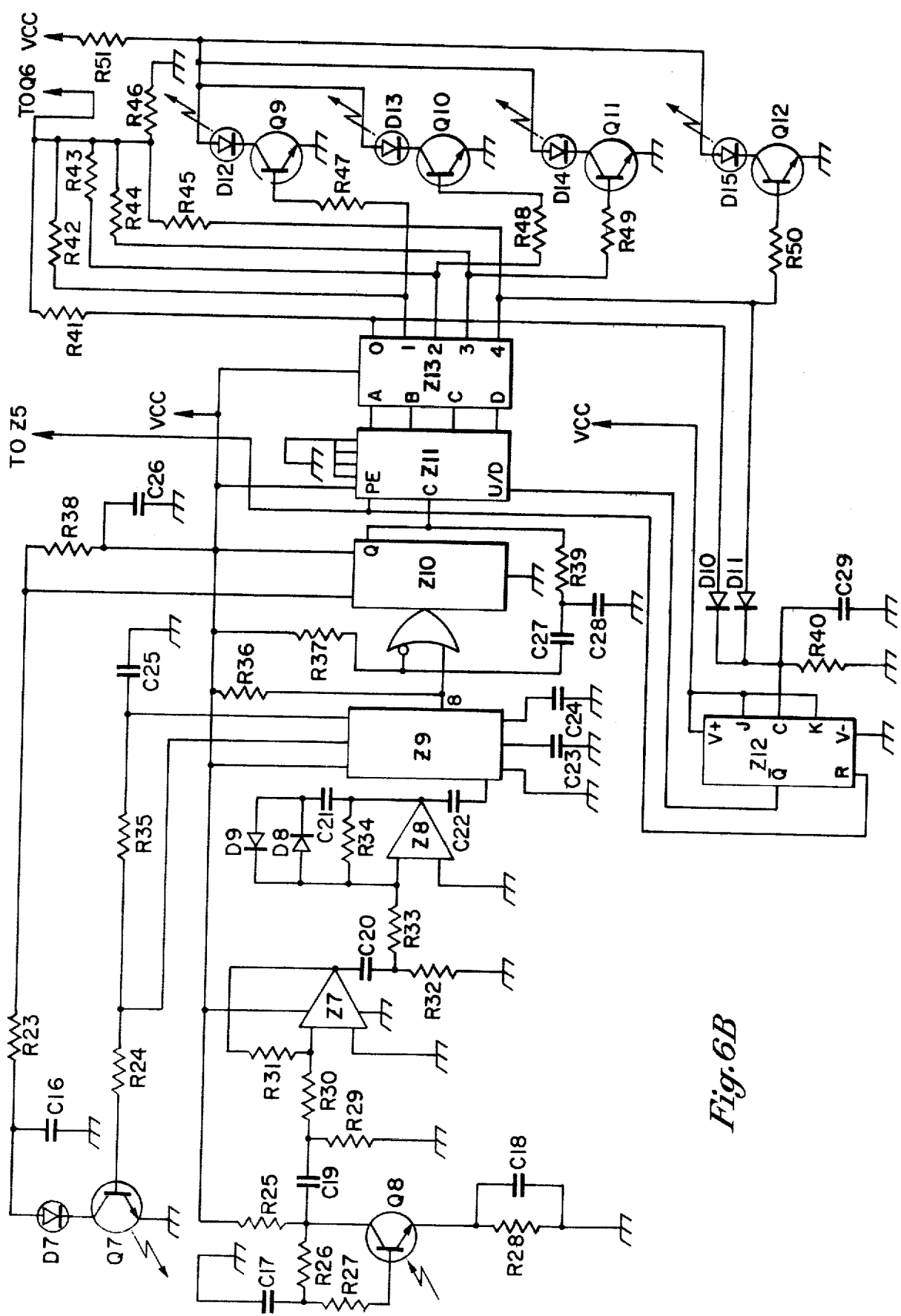

Referring to FIGS. 5 and 6B, the dimmer circuitry comprises amplifiers Z7 and Z8, a phase lock loop Z9, an astable oscillator Z10, an up-down counter Z11, and a digital to analog convertor and read out decoder Z13. The up-down counting operation of counter Z11 is controlled by Z13 through a J/K flip-flop, Z12, shown in FIG. 6B. The output of Z13 controls the trigger circuit which in turn controls the load switch to carry out the dimming operation.

Referring now to FIG. 6A, there will be described in detail the operation of the on-off circuitry and load switch TR1. The on-off circuitry comprises Z1, Z2, Z3, Z4 and Z5 as mentioned above, and in addition Q1, Q2, Q3, Q4, Q5 and their associated circuits. The load switch comprises D6 and Triac TR1, as mentioned above. Triac TR1 is triggered by the trigger circuit comprising BR2, Q6, R21, R22, and C15. The trigger circuit is controlled by the on-off circuit and the dimmer circuit.

Component Z3 is a phase-locked loop tone decoder with a free running oscillator whose frequency or repetition rate is determined by the values of resistor R13 and capacitor C9. Perferably it has a frequency of 4.5 KG but any frequency above 200 Hz may be employed for this circuit. The oscillator has a square wave output which is fed to L.E.D. driver Q1 through resistor R2, driving Q1 into saturation and permitting current to flow through the emitter D1 which is an infra-red L.E.D. This action causes D1 to emit a burst of infra-red radiation toward the front of the housing 21 and out into the room. The intensity of the infra-red radiation is determined by the current flowing through D1 which in turn is determined by the value of R1. Capacitor C1 is used for filtering. The infra-red radiation beam is turned on and off in step with the oscillator output.

Transistor Q2 is a phototransistor. Preferably the emitter D1 and detector Q2 both are focused and chosen as a matched pair. When the operator's hand is placed in the zone of actuation, a portion of the emitted infra-red beam is reflected off the hand to the phototransistor Q2. The phototransistor converts the reflected infra-red radiation received into a corresponding electrical signal amplifying it at the same time. Thus, the detector signal has an amplitude which is representative of the intensity of the infra-red radiation detected. Resistors R4, R5 and capacitor C2 form a bias compensation network to compensate for variation in ambient light conditions. As constant or low frequency light variations (60 Hz, 120 Hz, 180 Hz) from lights in the room enter the phototransistor, the collector voltage varies in step with it. This voltage variation is fed back through R4 and R5 to the base-emitter junction. This tends to keep the collector voltage constant, thus cancelling most of the unwanted low frequency signal. Thus, signals below about 200 cycles per second are rejected. At higher frequencies, however, capacitor C2 bypasses these collector variations to ground rather than back to the base. This action allows the Q2 circuit to function as a high pass amplifier passing only the higher frequencies on through C4 to the Z1 amplifier circuit. The value of C4 is chosen so as to present a high impedance to low frequencies. This further acts to reject any stray 60 Hz, 120 Hz or 180 Hz signals created by lights in the room. the R6, C3 combination in the emitter acts as a high impedance to low frequencies thus adding to the circuit's high pass characteristics.

The amplifier circuit of Z1 inverts and further amplifies the reflected signal and passes it to Z2 through capacitor C6 whose value also is chosen for high impedance to low frequencies. Amplifier Z2 performs three functions. It inverts the signal back to the proper phase for Z3; it further amplifies the signal, and with the feedback network of C5, D2 and D3; it serves to limit the signal level to Z3 to 600 millivolts to prevent overloading Z3 when strong signals are received.

Toner decoder Z3 receives the limited signal from Z2 and compares it to it's own oscillator frequency and phase. If the input to Z3 is above 20 millivolts and its frequency is substantially the same as that of the oscillator signal and is out of phase with the oscillator signal, the output voltage at the logic output of Z3 will drop from it's normally high state to a low state. This triggers Z4 into operation. Phase lock loop Z3 has a 0-14 percent band width adjustment and for the present circuit, a 5 percent band width is employed. Thus, tone decoder Z3 sees only 4.5 KC and a few cycles on either side and will not produce an output at other frequencies. Z3 is characterized such that it will not produce a logic output if the signal to its input is less than 20 millivolts. For control by a person's hand, the gain of amplifiers Z2 and Z3 is set or adjusted such that the output of Z2 to Z3 is greater than 20 millivolts when a human hand is placed within the zone of actuation and within about six inches from emitter D1 and detector Q2. When the hand is located beyond about six inches, the output of Z2 will be below 20 millivolts and Z3 will not trigger. This setting is desired in order to allow the switch to properly operate in a room and in order to allow one to achieve the desired control.

Component Z4 is a retriggerable monostable multivibrator with a pulse duration of approximately one second as determined by the values of R15 and C10. The purpose of Z4 is to insure that J/K flip-flop Z5 responds to only the first high to low transition of Z3's logic output and not to any additional transitions which may occur as the hand leaves or enters the zone of actuation. When the hand is placed in the zone of actuation within the preset distance from D1 and Q2, the logic output of Z3 will drop from its normally high state to a low state as mentioned above. The transistion of the logic output from the high to the low state triggers Z4. As long as the hand is located in the zone of actuation within the preset distance from D1 and Q2, the logic output of Z3 remains low. When the hand is moved away from D1 and Q2 beyond the preset distance, the input to Z3 begins to fall below 20 millivolts. When the input begins to fall below 20 millivolts, Z3 tries to lock onto this weak signal but cannot do so and its logic output switches from back and forth until the hand is moved completely out of range of D1 and Q2, at which time the logic output goes high and remains high. Without the monostable multivibrator Z4, Z3's random transitions would tend to retrigger Z5 as the hand is moved out of range from or within range of D1 and Q2, which is undesirable. With the use of the retriggerable monostable multivibrator Z4, Z5 is triggered by the onset of the output produced by Z4 which in turn was triggered by the first transition of Z3's logic output. The one second pulse duration output of Z4 prevents Z5 from being retriggered during the time period of this pulse output. This time period (about one second) is of sufficient duration to allow enough time to move one's hand completely within range of, or out of range from D1 and Q2, thus preventing any random pulses from Z3 which may occur as the hand enters or leaves the zone of actuation of D1 and Q2, from retriggering Z5.

As mentioned above, the onset of the output pulse from Z4 is used to trigger J/K flip-flop Z5 causing its Q and $\bar{Q}$ outputs to change states. The $\bar{Q}$ output of Z5 controls the trigger circuit and hence the load switch TR1 by turning it off or on as one's hand is passed in front of D1 and Q2 in the zone of actuation within the preset distance. Once Z5 has been triggered by passing one's hand in front of D1 and Q2, it remains in its new state until retriggered by again passing one's hand in front of D1 and Q2. Thus, Z5 acts as a memory circuit and keeps the light on (or off) once the hand is moved away from D1 and Q2.

In the dimmer circuit, R41-R46 form a voltage divider whose output is coupled to transistors Q5 and Q6 and provide the bias current to Q6. Each of R41-R45 has a different value. Components BR2, Q6, R21 and R22 combine to form a bi-directional variable resistance in series with capacitor C15. Its resistance value is determined by how hard transistor Q6 is turned on which in turn is determined by the bias current fed to it by the voltage divider R41-R46. This variable resistance in series with C15 forms an RC time delay used to trigger the Triac circuit consisting of D6 and TR1 at the desired time to provide the desired power output to the load. In effect, if the bias current to Q6 is low, the variable resistance is high and the Triac is fired later in each half of the AC cycle resulting in less power being fed to the load. If the Q6 bias current is high, however, the opposite is true in that a greater amount of power is being fed to the load.

Transistor Q5 is the actual on-off trigger device. It performs this function by being in either the saturated state and grounding out the bias voltage to Q6 or in the cutoff state and allowing the bias current to reach Q6. Transistor Q5 is controlled by the $\bar{Q}$ output of Z5.

Assume that the $\bar{Q}$ output of Z5 is high and the Q output of Z5 is low. In this state, the $\bar{Q}$ output of Z5 supplies current to the base-emitter junction of transistor Q4, driving it into saturation and causing the red L.E.D. D5 to glow giving an "Off" indication of the switch. The high $\bar{Q}$ output of Z5 also supplies current through R20 to the base-emitter junction of transistor Q5, driving it into saturation and grounding out the bias voltage to Q6 thereby presenting a high impedance to the RC network of the trigger circuit which delays the trigger pulse to the Triac TR1 sufficiently during each AC half cycle such that the Triac is not allowed to trigger during each AC cycle and is in effect "Off" thereby preventing power to be fed through the Triac to the load 51. In order to turn the load "On", one merely needs to pass his hand in front of D1 and Q2 within the zone of actuation and within the preset distance. This results in Z5 changing states with the $\bar{Q}$ output of Z5 going low and the Q output of Z5 going high. The high Q output of Z5 feeds current to the base-emitter junction of transistor Q3 driving it into saturation. This allows sufficient current to flow through the green L.E.D. D4 causing it to glow and indicate an "On" condition of the switch. The low $\bar{Q}$ output of Z5 causes Q5 to be in the "Off" state which allows bias current from voltage divider R41-R46 to reach Q6 thereby reducing the impedance to the RC network. This allows the Triac TR1 to be triggered earlier during each half of the AC cycle thereby allowing power to be fed through the Triac to the load 51. The amount of power fed to the load is proportional to the time during each AC half cycle in which the Triac is triggered or turned "On". If the Triac is turned "On" during the latter part of the AC half cycle, less power will be fed to the load, and conversely, if the Triac is turned "On" earlier in the AC half cycle, more power will be fed to the load. Thus, the "On" time during each AC half cycle depends upon the output from the voltage divider R41–R46.

Referring now to FIG. 6B, the dimmer circuit will be described in detail. The dimmer circuit includes components Z7, Z8, Z9, Z10, Z11, Z12, Z13, transistors Q7, Q8, Q9, Q10, Q11, and Q12 and their associated circuits. Transistor Q8 is a phototransistor. Preferably, emitter D7 and detector Q8 are focused and chosen as a matched pair. Operation of the circuitry of D7, Q7, Q8 and Z7–Z9 is identical to that of D1, Q1, Q2 and Z1–Z3 of the on-off circuitry discussed above. The frequency of the free-running oscillator in the phase lock loop tone decoder Z9, however, is somewhat different from that of Z3 in order to prevent possible crosstalk between circuits. In one embodiment, the frequency of the oscillator of Z9 is 6 KC. The gain of amplifiers Z7 and Z8 is such that when one's hand is located in front of D7 and Q8 in the zone of actuation and within about six inches therefrom the logic output of Z9 goes from a normally high state to a low state and stays there as long as the hand is held in that position. Z9 produces a low output as long as its input signal is above 20 millivolts and has a frequency substantially the same as that of the frequency of its oscillator and is out of phase with its oscillator signal. The output of Z9 stays low until the hand is moved away from D7 and Q8.

Component Z10 is a retriggerable monostable multivibrator connected to act as a triggerable astable oscillator whose frequency is about 1 Hz per second. When the hand is placed in front of D7 and Q8, the reflected signal is processed through Q8, Z7, Z8 and applied to Z9. The output of Z9 then goes to a low state and stays there until the hand is removed. This action triggers Z10 into oscillation. The output of Z10 is fed to Z11 which is an up/down binary coded decimal counter. It counts the number of pulses received from Z10 and provides a BCD output on the four output terminals to Z13 which in this version is a BCD/1 to 10 decoder. Decoder Z13 decodes the BCD output of Z11 and sequentially provides a high state to one of its five output pins (0–4). In this circuit, only five of its output pins are used. Resistors R41–R45 are coupled to outputs 0–4 respectively to allow one to obtain five levels of brightness for the load 51. Each of resistors R41–R45 of the voltage divider has a different value whereby the amount of current delivered to Q6 depends upon which output pin of Z13 is high. Rather than have the counter Z13 count in one direction and reset itself, J/K flip-flop Z12 is provided to have the counter Z13 automatically reverse itself during the counting sequence when its upper and lower levels are reached as long as one's hand is located in front of D7 and Q8. The 0 and 4 output pins of Z13 are coupled to the clock input of Z12 by way of diodes D10 and D11. The $\bar{Q}$ output of Z12 is coupled to the up/down input of Z11. As long as the up/down input is high the counter will count up. When it goes low, the counter will count down. When either of the 0 or 4 outputs of Z13 turns high, a high input will be fed to the clock input of Z12 causing it to change states. Capacitor C29 is used to obtain a slight delay and resistor R40 is used for discharging the capacitor. Assume that the counter is counting up whereby the Q output of Z12 is high. When the 4 output of Z13 reaches a high state, Z12 changes states and the $\bar{Q}$ output of Z12 feeds a low input to the up/down input of Z11. This causes the counter to count down. When it reaches 0, it agains counts up and continues the up/down counting as long as the hand is located in frong of D7 and Q8. When the counter counts up from 0 to 4, the light becomes dimmer. When it counts down from 4 to 0, the light becomes brighter. The one second interval for each counting pulse is sufficient to allow one time enough to remove his hand from D7 and Q8 when the desired brightness is achieved. Maximum brightness occurs when the 0 output of Z13 is high. The 1 through 4 outputs of Z13 are coupled to L.E.D. indicators D12–D15 through Q9–Q12, respectively. Thus, as the 1–4 outputs of Z13 sequentially become high, D12–D15 sequentially are actuated to allow the operator to determine the brightness level and to maintain this brightness level by removing the hand from D7 and Q8. With this system and arrangement, the desired brightness level may be set prior to turning on the light. As described above the light is turned on by placing one's hand in front of D1 and Q2.

T1, BR1, C12, C11, and Z6 form the power supply to power both the on-off dimmer circuits. Transformer T1 remaines connected across the AC line at all times and IC6 is a three pin regulator of an appropriate voltage. L1 and C14 form a noise suppression circuit.

Components R16 and C13 form a power-on reset circuit. Its function is to insure that Z5, Z11 and Z12 all come on in the proper state when power is first applied to the unit. If power is removed from an installed unit (due to blackout, storms, etc.), the switch circuit will automatically come on in the "Off" and the dimmer circuit will automatically reset itself to the full brightness level once power is again restored.

Figure 7:
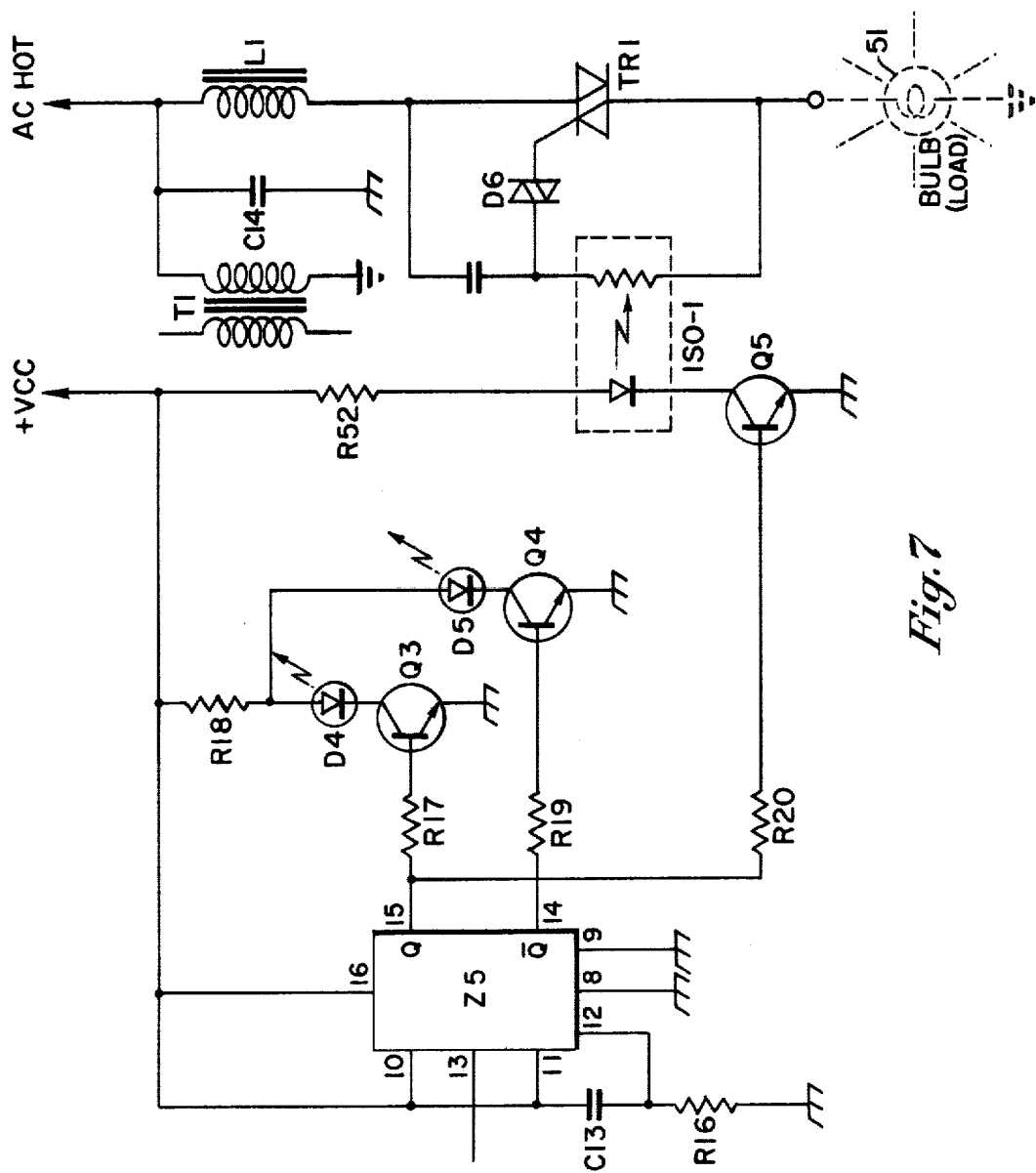
FIG. 7 is an embodiment of the switch of the present invention which is employed only for on-off purposes.

Referring now to FIG. 7, there will be described a trigger circuit which is employed in an embodiment of the switch which at present is used for on-off purposes only. In this embodiment, the dimmer circuitry is not employed. The on-off circuitry is the same as described previously through Z5 except that Q5 is coupled to the Q output of Z5 rather than to the $\bar{Q}$ output. In FIG. 7, pin 15 represents the Q output and pin 14 represents the $\bar{Q}$ output. Transistor Q5 is coupled to ISO-1 which is an opto-isolator which comprises an L.E.D. and a light sensitive resistor. When Z5 is in the "On" state, pin 15 is high and pin 14 is low. The current from Z5 pin 15 lights up D4 as described previously, but it also actuates Q5 and causes current to flow through the L.E.D. section of ISO-1. The value of the resistor section of ISO-1 is dependent on the light output of the L.E.D. section. As the L.E.D. lights up, light falls on the resistor section (which is actually a photocell of cadmium sulfide) and reduces the resistance from a high value to a low value which triggers TR1 the same way as the BR2/Q6 combination did as described previously, and turns the bulb 51 on. When Z5 changes to the "Off" state, current ceases to flow through the L.E.D. section of ISO-1. The resistor section of ISO-1 returns to a high resistance and TR1 is no longer triggered on. This circuit allows complete electrical isolation from the AC line.

Many distinct advantages can be seen in the present invention for controlling lighting over conventional techniques. First, it conserves energy and lengthens bulb life over ordinary means. Second, since touching of the switch is not necessary to activate it, dirty walls around light switch plates are eliminated. Static electric shocks (created by walking across a carpet) also are eliminated. The switch can be operated even with an arm load of packages. Since the switch has no moving parts to create a spark, the danger of accidental explosion in a room full of gas is greatly reduced or eliminated. Since touching the switch is not necessary, it can be activated safely even with wet hands or while standing on a wet surface. The cover is designed so that no metal parts (screws, etc.) are exposed to create a shock hazard. The dimmer circuit also has advantages since it gives well lit, easy to read indications of exact brightness levels. It allows the operator to preset the brightness level desired before turning on the light. It replaces bulky, ugly knob and plate associated with conventional dimmers with an attractive decorator case.

The distance from D1 and Q2 and from D7 and Q8 which one must place his hand to trigger Z3 or Z9 preferably is less than about six inches. The distance could be greater, however, if it becomes too great then one merely entering the room would be able to actuate the on-off circuitry or possibly the dimming circuitry which would be undesirable in most cases. From a practical standpoint, if the switch and dimmer are to be used for controlling lights or, for example, an electric motor, the distance which one places his hand from D1 and Q2 and from D7 and Q8 for triggering Z3 or Z9 should be no greater than about one foot.

In the preferred embodiment, the on-off switch and dimmer circuit are used for controlling lights, however, they could be used for other purposes, for example, for controlling elevators, certain types of motors, hand dryers in restrooms, home appliances such as garbage disposal units, T.V.s, stereos, or various indoor or outdoor devices such as counting systems, swimming pool equipment, sprinkler systems, etc.

Preferably D1 and D7 and Q2 and Q8 are emitters and detectors of infra-red radiation. In one embodiment, they are L.E.D.s rated at 940 nanometers. The use of infra-red radiation has advantages since it is not visable to the human eye. It is to be understood, however, that D1 and D7 could be light emitting diodes which emit radiation in the visible part of the electromagnetic spectrum. In this embodiment, Q2 and Q8 would be detectors for detecting visible light from D1 and D7 reflected from one's hand or other object.

Figure 10:
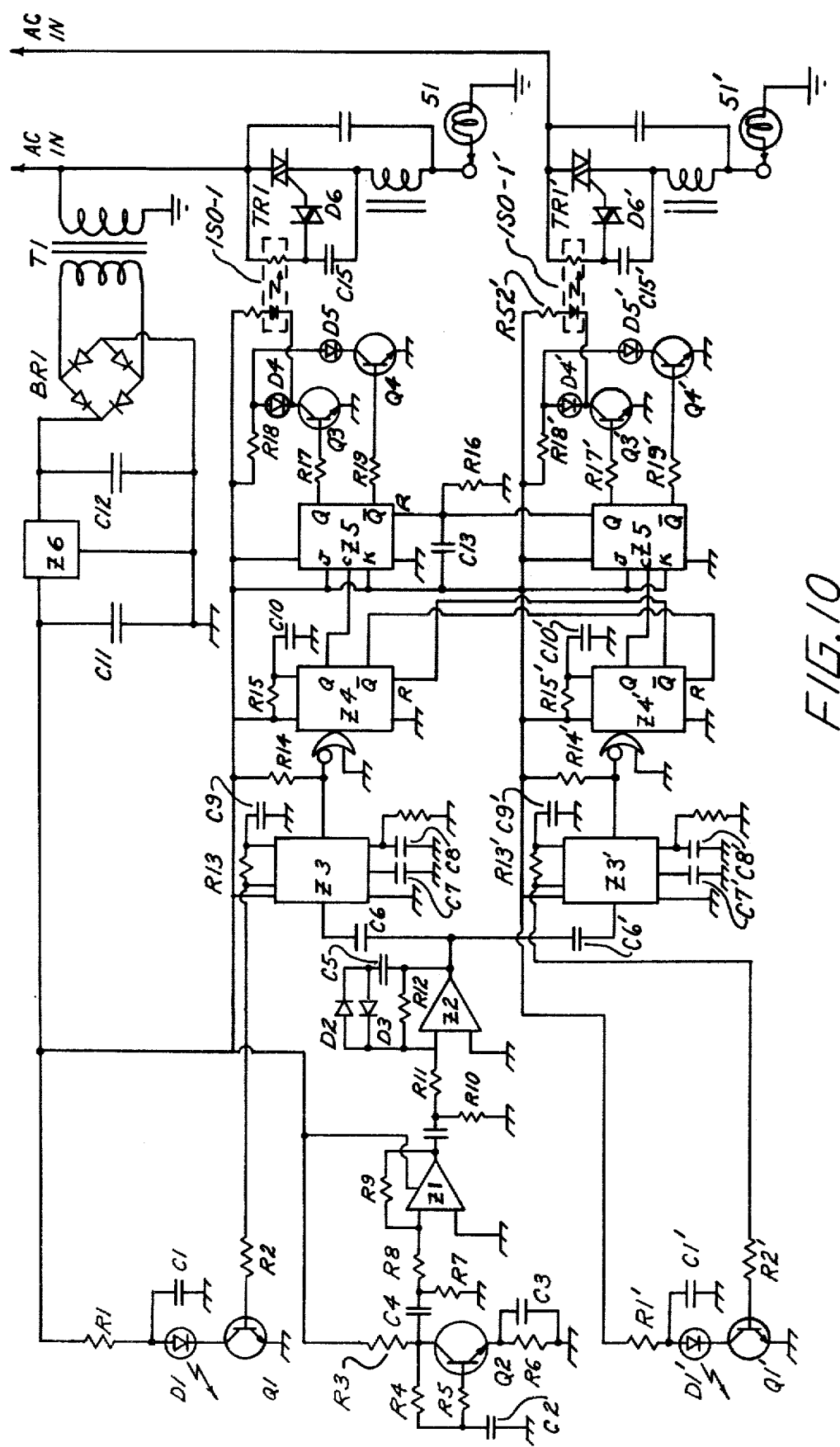
FIG. 10 is an electrical schematic diagram of the circuitry of the switch means of FIGS. 8 and 9.

Referring now to FIGS. 8-10, there will be described the dual switch embodiment comprising two sources of infra-red radiation and a common detector for independently controlling two separate loads. The circuitry of FIG. 10 employs many of the same components of FIG. 6A connected to operate in the same manner. In FIG. 10, like components are identified with like reference characters or numerals as shown in FIG. 6A. For example in the circuitry of FIG. 10, source D1, transistor Q1, detector Q2, amplifiers Z1 and Z2, tone decoder Z3, retriggerable monostable multivibrator Z4, J/K flip flop Z5, L.E.D. D4, L.E.D. D5, and transistors Q3 and Q4 are the same as that disclosed in FIG. 6A. Components D1, Q1, Q2, Z1, Z2, Z3, Z4, and Z5 of FIG. 10 operate in the same manner as described in connection with FIG. 6A (when Z4 is enabled) to control light bulb 51 by way of the opto-isolator ISO-1 and triac TR1 as disclosed in FIG. 7. The opto-isolator ISO-1 is connected between D4 and Q3. The lower circuitry of FIG. 10 including D1', Q1', Z3', Z4', Z5', D4', D5', Q3', Q4', ISO-1', TR1' is a duplicate of the upper circuitry having the same reference characters and is employed for controlling a second light bulb 51'. The lower circuitry is distinguished from the upper circuitry by the use of prime symbols. In FIG. 10, the $\bar{Q}$ pin of Z4 is connected to the reset pin R of Z4' and the $\bar{Q}$ pin of Z4' is connected to the reset pin R of Z4. A low on the reset pin of Z4 or Z4' resets the one shot thereby inhibiting that one shot and maintaining its output on the Q pin at zero. Each of the J/K flip-flops Z5 and Z5' changes states when the input to its clock pin C goes from a low to a high level. If Z4 or Z4' is inhibited, its associated J/K flip-flop Z5 or Z5' cannot change states.

Referring to FIGS. 8 and 9, the dual switch circuitry of FIG. 10 is mounted in the housing 21 with the infra-red emitters D1 and D1' and the infra-red detector Q2 supported to face forward through windows 61, 63 and 65 respectively formed through the front wall 21C of the housing 21. Windows 67 and 69 are employed for viewing on-off indicators D4, D5, and D4', D5' respectively.

The emitters D1 and D1' preferably are focused emitters and the detector Q2 preferably is a focused detector. In operation, emitter D1 emits a beam of infra-red radiation which fans out as depicted by lines 71 and 72 in FIG. 9. Emitter D1' also emits a beam of infra-red radiation which fans out as depicted by lines 73 and 75. Emitters D1 and D1' are focused such that each emits infra-red radiation which is predominently within a cone shaped beam defined by an angle of 10° between opposite sides. Detector Q2 is focused such that it detects radiation predominently within a cone, indicated by lines 77 and 79, and which is defined by an angle of 10° between opposite sides. As shown, emitters D1 and D1' are located on opposite sides of Q2. The predominent view of Q2 overlaps the beams of D1 and D1'. The overlapped area of D1 and Q1 is defined as zone actuation A and the overlapped area of D1' and Q2 is defined as zone of actuation B. When an object such as one's hand is placed in either of the zones A or B, a portion of the emitted infra-red radiation is reflected off of the hand to Q2. The output of Q2 is amplified at Z1 and Z2 and applied to Z3 and Z3'. The circuitry of FIG. 10 including the upper and lower circuitry is adjusted such that when an object such as one's hand is located within a preset distance of about 6 inches from housing face 21C (and hence from D1, Q2, D1') and within zone A or zone B, the output of Z3 or Z3' respectively will drop from its normal high state to a low state as described in connection with FIG. 6A. Referring to FIG. 9, when one moves one's hand in front of D1, Q2, and D1', within the preset distance from D1, Q2, Q1', from an upper position to a lower position (in plane 80) the outputs of Z3 and Z3' behave as follows. When the hand reaches level 81 as shown in FIG. 9, the output of Z3 drops from its normally high state to its low state and stays there until the hand reaches level 85 at which time it will go high. Between levels 81 and 83, the output of Z3' is at its normal high state. When the hand reaches level 83 the output of Z3' drops from its normally high state to a low state and stays there until the hand reaches level 87 at which time it will go high. Thus when the hand moves downward in front of D1, Q2, D1', the output of Z3 drops first and then the output of Z3' drops. When moving the hand upward in front of D1', Q2, D1 in an opposite direction, the output of Z3' drops first and then the output of Z3 drops.

When moving one's hand downward in front of D1, Q2, D1' the circuitry of FIG. 10 acts in the following manner. This assumes that the hand is moved rapidly downward across D1, Q2, D1' (within the one second pulse period of Z4 and Z4'). When the output of Z3 drops from a high to a low, the $\bar{Q}$ pin of Z4 goes from a low to a high and causes Z5 to change states to either turn bulb 51 on or off. Simultaneously, the Q pin or Z4 goes from a high to a low and substantially simultaneously disables Z4' through its reset pin R. As the hand passes on down, the output of Z3' will drop from a high to a low but since Z4' is disabled, it cannot cause Z5+ to change states and hence the bulb 51' will not be turned on or off. Thus if bulb 51 is off one can turn it on without affecting bulb 51' by moving one's hand downward in front of D1, Q2, D1'. In order to turn 51 off, one merely needs to pass one's hand downward again in front of D1, Q2, D1'. Bulb 51' will remain unaffected.

When moving one's hand rapidly upward in front of D1', Q2, D1 (within the one second period), the circuitry of FIG. 10 acts in the following manner. When the output of Z3' drops from a high to a low, the Q pin of Z4' goes from a low to a high and causes Z5' to change states to either turn bulb 51' on or off. Simultaneously, the $\bar{Q}$ pin of Z4' goes from a high to a low and substantially simultaneously disables Z4 through its reset pin R. Thus as the hand passes on up, the output of Z3 will drop from a high to a low but since Z4 is disabled, it cannot cause Z5 to change states and hence the bulb 51 will not be turned on or off. Thus if bulb 51' is off, one can turn it on without affecting bulb 51 by moving one's hand upward in front of D1', Q2, D1. In order to turn 51' off, one merely needs to pass one's hand upward again in front of D1', Q2, D1. Bulb 51 will remain unaffected.

Figure 11A:
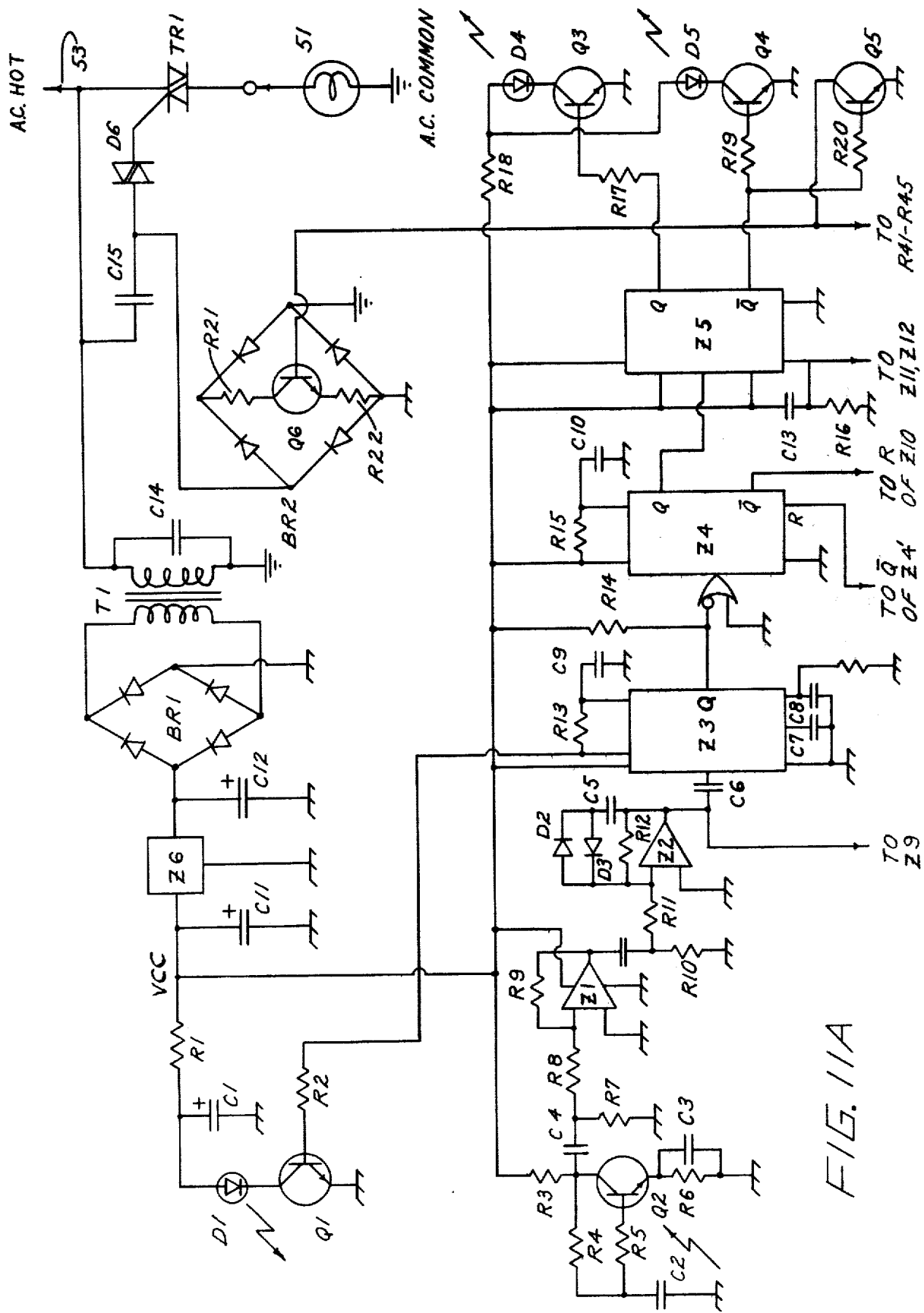
FIG. 11A and 11B are elctrical schematic diagrams of circuitry for providing on-off and dimming control of a single load employing two sources and a common detector.
Figure 11B:
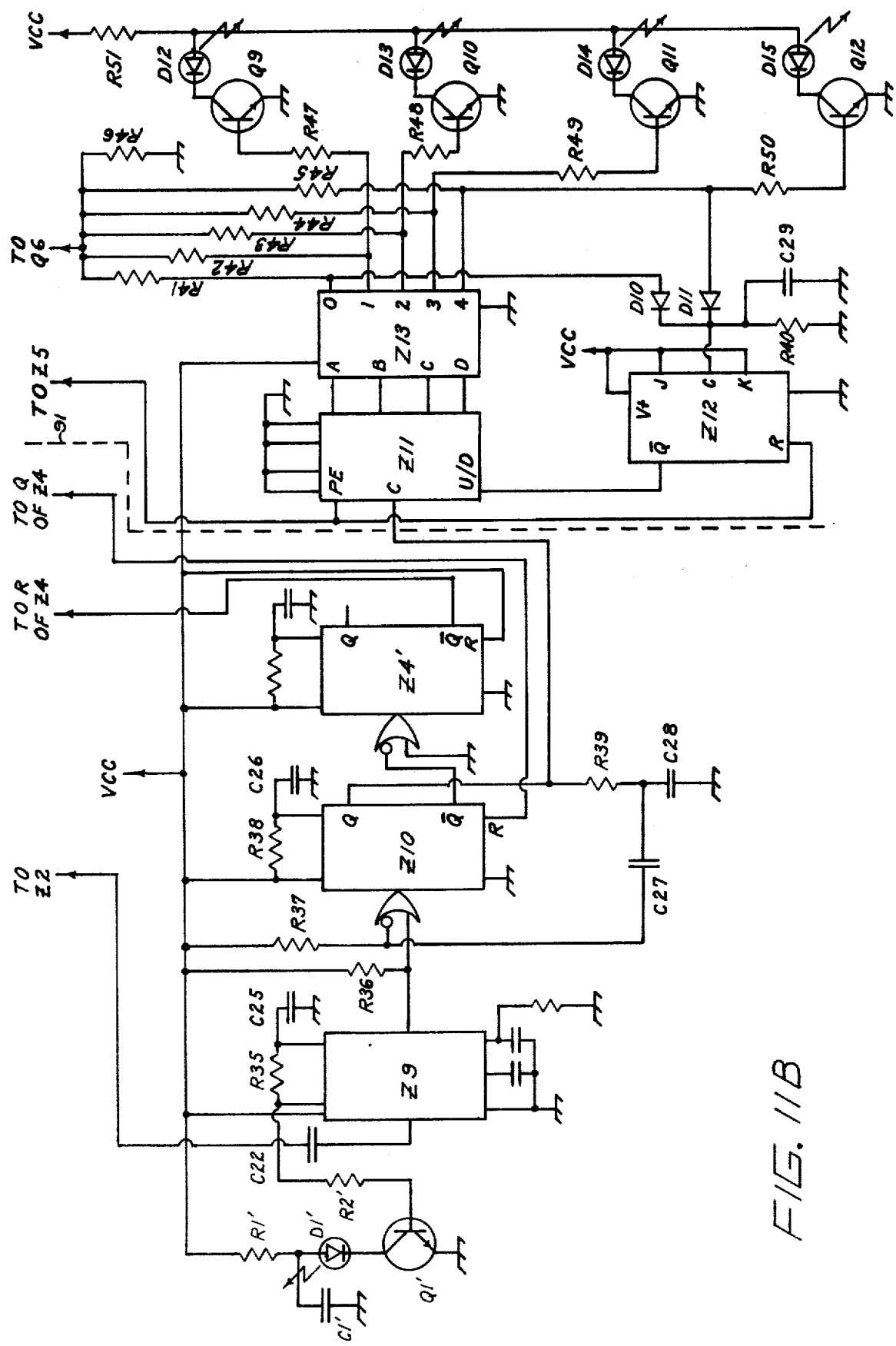

Referring now to FIGS. 11A and 11B, there will be described the circuitry for providing on-off and dimming control of a single load employing two sources and a common detector. The load is the light bulb 51. The two sources are the infra-red emitters D1 and D1' described previously and the common detector is Q2 also described previously. The circuitry of FIG. 11A is the same as that of FIG. 6A except that the output of Z2 is also applied to the input of Z9 of FIG. 11B; the $\bar{Q}$ pin of Z4 is connected to the reset pin R of Z10 of FIG. 11B; and the reset pin R of Z4 is connected to the $\bar{Q}$ pin of Z4'. The circuitry of FIG. 11B is the same as that of FIG. 6B to the right of dotted line 91. It also employs Z9 and Z10 of FIG. 6B. The output of the Free Running oscillator of Z9 is fed to driver Q1' through resistor R2' for causing D1' to periodically emit busts of infra-red radiation. The $\bar{Q}$ pin of Z10 is connected to the input of Z4'. Z4' is the same as Z4' disclosed in the circuitry of FIG. 10. The Q pin of Z10 is connected to the C pin of Z11. The $\bar{Q}$ pin of Z4' is connected to the R pin of Z4 and the R pin of Z10 is connected to the $\bar{Q}$ pin of Z4. Anytime the $\bar{Q}$ pin of Z4 is in a low state, Z10 is prevented from oscillating, thereby inhibiting the dimming function. If the pin $\bar{Q}$ of Z4' is in a low state, the one shot Z4 cannot be triggered into operation by Z3, thus inhibiting the on-off circuitry during the dimming sequence. The J/K flip-flop Z5 changes states only when the input to its clock pin C goes from a low to a high level. If Z4 is inhibited, its associated J/K flip-flop Z5 cannot change states.

Infra-red emitters D1 and D1' and infra-red detector Q2 are supported to face forward through windows 61, 63, and 65 respectively of housing 21 as described in connection with FIG. 8. Windows 67 and 69 are employed for viewing on-off indicators D4, D5 and D4', D5' respectively. Window 93 is employed for viewing dimmer indicators D12-D15. Emitters D1 and D1' and detector Q2 are characterized and operate in the same manner as described in connection with FIG. 9. When one's hand moves downward in front of D1, Q2, and D1' within the preset distance (within plane 80) the outputs of Z3 and Z9 behave as follows. When the hand reaches level 81, the output of Z3 drops from its normally high state to its low state and stays there until the hand reaches level 85 at which time it will go high. Between levels 81 and 83, the output of Z9 remains at its normal high state. When the hand reaches level 83 the output of Z9 drops from its normally high state to a low state and stays there until the hand reaches level 87 at which time it will go high. Thus when the hand moves downward in front of D1, Q2, D1', the output of Z3 drops first and then the output of Z9 drops. When moving the hand upward in front of D1', Q2, D1 in an opposite direction, the output of Z9 drops first and then the output of Z3 drops.

When moving one's hand downward in front of D1, Q2, D1, the circuitry of FIGS. 11A and 11B acts in the following manner. This assumes that the hand is moved rapidly downward across D1, Q2, D1'. When the output of Z3 drops from a high to a low, the Q pin of Z4 goes from a low to a high and causes Z5 to change states to either turn bulb 51 on or off as described previously in connection with FIG. 6A. Simultaneously, the $\bar{Q}$ pin of Z4 goes from a high to a low and substantially simultaneously inhibits Z10 through its reset pin R. As the hand passes on down, the output of Z9 will drop from a high to a low but since Z10 is inhibited, it cannot affect Z11 and hence the dimming circuitry to the right of dotted line 91. Thus if bulb 51 is off one can turn it on without affecting the dimming circuitry to the right of line 91, by moving one's hand downward in front of D1, Q2, D1'. In order to turn 51 off, one merely needs to pass one's hand downward again in front of D1, Q2, D1'. The dimming circuity to the right of line 91 will remain unaffected.

When moving one's hand upward in front of D1', Q2, D1 the circuitry of FIGS. 11A and 11B acts in the following manner. When the output of Z9 drops from a high to a low, Z10 is triggered into oscillation and continues to oscillate as long as the output of Z9 remains low. Z9 will remain low as long as the hand is in front of D1' and Q2 in the zone of actuation B. As soon as Z10 is triggered, its $\bar{Q}$ pin goes from a high to a low and triggers Z4' to fire. Z4' is a retriggerable one shot with a time period longer than that of Z10. As Z10 oscillates, its $\bar{Q}$ pin continuously retriggers Z4', keeping the Z4' $\bar{Q}$ pin at a low state and inhibiting Z4 from triggering Z5 (FIG. 11A), as long as Z10 continues to oscillate. Since Z4 is inhibited, Z5 cannot change states. Counter Z11 counts the output pulses from Q of Z10 and the dimmer circuitry to the right of line 91 operates in the same manner as described in connection with FIG. 6B. If the light 51 is on, it is dimmed in step with the oscillations of Z10. Z10 continues to oscillate as long as the hand is held in front of D1' and Q2 in the zone of acutation B. When the hand is removed, Z10 stops oscillating. Even if the light 51 is off, the dimming circuit of FIG. 11B can still be activated to preset the dimmer to the desired level whereby the desired brightness of the light 51 will be achieved when the circuit of FIG. 11A is activated to turn the light on.

What is claimed is:

1. A switch for control purposes, comprising:

a source for producing electromagnetic radiation, a detector located relative to said source for detecting electromagnetic radiation from said source reflected from an object when placed in front of said source and detector at a position spaced therefrom, control means adapted to be placed in either of two states when actuated, said control means being characterized such that when it is placed in either of said states, it remains in that state until actuated at which time it changes states, circuit means responsive to the output of said detector for actuating said control means when the object is located in front of said source and said detector at a position within a predetermined distance therefrom, said circuit means preventing said control means from being reactuated as long as the object is in front of said source and detector at a position within said predetermined distance therefrom, and load switch means adapted to be coupled to a supply of electrical energy and to a load for controlling the flow of electrical energy from said supply to said load, said control means being employed to control said load switch means for allowing the flow of electrical energy from said supply to said load when said control means is in one state and for terminating the flow of electrical energy from said supply to said load when said control means is in the other of said states.

2. The switch of claim 1 wherein:

said source and detector are located to face in a first direction, a second source for producing electromagnetic radiation, a second detector located relative to said second source for detecting electromagnetic radiation from said second source reflected from an object when placed in front of said second source and said second detector at a position spaced therefrom, said second source and said second detector being located to face in a direction different from said first direction, means responsive to the output of said second detector for producing an output signal as long as the object is located in front of said second source and said second detector within a given distance therefrom, said output signal terminating when the object is moved to a position relative to said second source and said second detector which is beyond said given distance, oscillator means responsive to said output signal for producing oscillator signals at a given frequency, and means responsive to said oscillator signals for controlling said load switch means for causing said load switch means to vary the flow of electrical energy from said supply to said load in step with said oscillator signals when said control means is in said one state.

3. A switch for control purposes, comprising:

a source for producing electromagnetic radiation, a detector located relative to said source for detecting electromagnetic radiation from said source reflected from an object when placed in front of said source and said detector at a position spaced therefrom, means responsive to the output of said detector for producing an output signal as long as the object is located in front of said source and detector within a predetermined distance therefrom, said output signal terminating when the object is moved to a position relative to said source and detector which is beyond said predetermined distance.

control means adapted to be placed in either of two states when actuated, said control means being characterized such that when it is placed in either of said states, it remains in that state until actuated at which time it changes states, timing means adapted to be actuated by said output signal for producing a timing signal having a predetermined time duration, said control means being actuated by said timing signal, and load switch means adapted to be coupled to a supply of electrical energy and to a load for controlling the flow of electrical energy from said supply to said load, said control means being employed to control said load switch means for allowing the flow of electrical energy from said supply to said load when said control means is in one state and for terminating the flow of electrical energy from said supply to said load when said control means is in the other of said states.

4. The switch of claim 3 wherein:

said source and detector are located to face in a first direction, a second source for producing electromagnetic radiation, a second detector located relative to said second source for detecting electromagnetic radiation from said second source reflected from an object when placed in front of said second source and said second detector at a position spaced therefrom, said second source and said detector being located to face in a direction different from said first direction, means responsive to the output of said second detector for producing a second output signal as long as the object is located in front of said second source and said second detector within a given distance therefrom, said second output signal terminating when the the object is moved to a position relative to said second source and said second detector which is beyond said given distance, oscillator means responsive to said second output signal for producing oscillator signals at a given frequency, means responsive to said oscillator signals for controlling said load switch means for causing said load switch means to vary the flow of electrical energy from said supply to said load in step with said oscillator signals when said control means is in said one state.

5. A switch for control purposes, comprising:

means including a source for producing bursts of electromagnetic radiation at a predetermined frequency, detector means located relative to said source for detecting bursts of electromagnetic radiation from said source reflected from an object when placed in front of said source and detector means at a position spaced therefrom, said detector means being characterized such that it produces output pulses upon detection of electromagnetic radiation bursts from said source reflected from the object when placed in front of said source and detector means at a position spaced therefrom, said output pulses having a magnitude representative of the intensity of said reflected electromagnetic radiation bursts detected, control means adapted to be placed in either of two states when actuated, said control means being characterized such that when it is placed in either of said states, it remains in that state until actuated at which time it changes states, circuit means including timing means coupled between said detector means and said control means and responsive to said output pulses for producing a timing signal of a predetermined time duration for actuating said control means for causing said control means to change states, said predetermined time duration being substantially greater than the time of each cycle of said predetermined frequency, load switch means adapted to be coupled to a supply of electrical energy and to a load for controlling the flow of electrical energy from said supply to said load, said control means being employed to control said load switch means for allowing the flow of electrical energy from said supply to said load when said control means is in one state and for terminating the flow of electrical energy from said supply to said load when said control means is in the other of said states.

6. The switch of claim 5 wherein said load comprises an electric light bulb.

7. The switch of claim 5 wherein said source comprises an emitter of infra-red radiation and said detector means comprises a detector of infra-red radiation.

8. The switch of claim 6 wherein said source comprises an emitter of infra-red radiation and said detector comprises a detector of infra-red radiation.

9. The switch of claim 5 wherein:
said circuit means comprises:
amplifier means coupled to the output of said detector means for amplifying said output pulses,
frequency discriminating means coupled to the output of said amplifier means for producing an output signal in response to said amplified output pulses only when said amplified output pulses are above a predetermined level and only when said amplified output pulses are produced at a frequency substantially the same as said predetermined frequency,
said timing means being responsive to the onset of said output signal for producing said timing signal.

10. The system of claim 9 wherein said amplified output pulses above said predetermined level are produced upon detection of bursts of electromagnetic radiation reflected from the object only when the object is located at a distance from said source and detector means which is less than about one foot.

11. The switch of claim 5 wherein:
said means including said source produce bursts of electromagnetic radiation at a frequency greater than about 200 bursts per second,
filter means for passing to said circuit means substantially only signals from said detector means having frequencies greater than about 200 cycles per second.

12. The switch of claim 5 wherein:
said source and detector means are located to face in a first direction,
means including a second source for producing bursts of electromagnetic radiation at a given frequency,
second detector means located relative to said second source for detecting bursts of electromagnetic radiation from said second source reflected from an object when placed in front of said second source and said second detector means at a position spaced therefrom,
said second source and said second detector means being located to face in a direction different from said first direction,
said second detector means being characterized such that it produces output pulses upon detection of electromagnetic radiation bursts from said second source reflected from the object when placed in front of said second source and said second detector means at a position spaced therefrom,
said output pulses from said second detector means having a magnitude representative of the intensity of said electromagnetic radiation bursts detected by said second detector means;
circuit means coupled to the output of said second detector means for producing an output signal only when the input signals applied thereto are above a predetermined level and only when said input signals applied thereto are produced at a frequency substantially the same as said given frequency,
oscillator means responsive to said output signal for producing oscillator signals at a relatively low frequency,
decoder means having a plurality of output terminals,
a plurality of resistor means coupled respectively to said plurality of output terminals,
each of said resistor means having different resistive values,
counting means responsive to said oscillator signals for causing said decoder means to sequentially apply a voltage to each of said output terminals and hence across each of said resistor means,
means coupled from said resistor means to said load switch means for allowing the voltage sequentially applied across each of said resistor means to sequentially control said load switch means in step with said oscillator signals to sequentially allow different values of electrical energy from said supply to flow to said load when said control means is in said one state.

13. The switch of claim 12 wherein said counting means is an up-down counter.

14. A switch for controlling a load, comprising:
an emitter for emitting infra-red radiation,
means for periodically actuating said emitter for causing said emitter to emit bursts of infra-red radiation at a predetermined frequency,
a detector located relative to said emitter for detecting bursts of infra-red radiation from said emitter reflected from an object when placed in front of said emitter and detector at a position spaced therefrom, said detector producing output pulses upon detection of infra-red radiation bursts from said emitter reflected from the object when placed in front of said emitter and detector, said output pulses having an amplitude representative of the intensity of said reflected infra-red radiation bursts detected, a flip-flop adapted to be placed in either of two states when actuated, said flip-flop being characterized such that when it is placed in either of said states, it remains in that state until actuated at which time it changes states, amplifier means coupled to the output of said detector for amplifying said output pulses, frequency discriminating means responsive to said amplified output pulses for producing an output signal only when said amplified output pulses are above a predetermined level and only when said amplified output pulses are produced at a freqeuency substantially the same as said predetermined frequency, said amplified output pulses above said predetermined level being produced when the object is located close to said emitter and detector, timing means coupled to the output of said frequency discriminating means for producing a timing signal of a predetermined time duration when actuated by said output signal for actuating said flip-flop for causing said flip-flop to change states, said timing signal having a time duration sufficient to allow a person to remove the object away from said emitter and detector before said timing signal terminates, load switch means adapted to be coupled to a supply of electrical energy and to a load for controlling the flow of electrical energy from said supply to said load, said flip-flop being employed to control said load switch means for allowing the flow of electrical energy from said supply to said load when said flip-flop is in one state and terminating the flow of electrical energy from said supply to said load when said flip-flop is in the other of said states.

15. The switch of claim 14 wherein:

said emitter and detector are located to face in a first direction, a second emitter for emitting infra-red radiation, means for periodically actuating said second emitter for causing said second emitter to emit bursts of infra-red radiation at a given frequency, a second detector located relative to said second emitter for detecting bursts of infra-red radiation from said second emitter reflected from an object when placed in front of said second emitter and said second detector at a position spaced therefrom, said second emitter and said second detector being located to face in a direction different from said first direction, said second detector being characterized such that it produces output pulses upon detection of infra-red radiation bursts from said second emitter reflected from the object when placed in front of said second emitter and said second detector at a position spaced therefrom, said output pulses from said second detector having a magnitude representative of the intensity of said infra-red radiation bursts detected by said second detector, circuit means coupled to the output of said second detector for producing an output signal only when the input signals applied thereto are above a predetermined level and only when said input signals applied thereto are produced at a frequency substantially the same as said given frequency, oscillator means responsive to said output signal for producing oscillator signals at a relatively low frequency, decoder means having a plurality of output terminals, a plurality of resistor means coupled respectively to said plurality of output terminals, each of said resistor means having different resistive values, counting means responsive to said oscillator signals for causing said decoder means to sequentially apply a voltage to each of said output terminals and hence across each of said resistor means, means coupled from said resistor means to said load switch means for allowing the voltage sequentially applied across each of said resistor means to sequentially control said load switch means in step with said oscillator signals to sequentially allow different values of electrical energy from said supply to flow to said load when said flip-flop is in said one state.

16. A switch for control purposes, comprising:

a first source for producing electromagnetic radiation, a second source for producing electromagnetic radiation, a detector for detecting electromagnetic radiation, said first and second sources and said detector being located relative to each other and characterized such that in a given plane in front of and spaced from said first and second sources and from said detector, first and second areas exist such that when an object is located in said first area said detector detects predominantly reflected radiation from said first source and when an object is located in said second area, said detector detects predominantly reflected radiation from said second source, first means responsive to the output of said detector for producing a first output signal when an object is located in said first area, second means responsive to the output of said detector for producing a second output signal when an object is located in said second area, first and second control means each being adapted to be placed in either of two states when actuated, each of said first and second control means being characterized such that when it is placed in either of said two states, it remains in that state until actuated at which time it changes to the other of said states, first and second timing means adapted to be actuated by the onset of said first and second output signals, respectively, for producing first and second timing signals each having a predetermined time duration, said first and second control means being actuated by the onset of said first and second timing signals respectively, said first timing means having an output coupled to said second timing means for disabling said second timing means when said first timing means is actuated, said second timing means having an output coupled to said first timing means for disabling said first timing means when said second timing means is actuated, first and second load switch means adapted to be coupled to a supply of electrical energy and to first and second loads respectively for controlling the flow of electrical energy from said supply to said first and second loads, said first and second control means being employed to control said first and second load switch means respectively for controlling the flow of electrical energy from said supply to said first and second loads, each of said first or second control means when actuated terminating the flow of electrical energy from said supply to its associated load when in one state and allowing flow of electrical energy from said supply to its associated load when in the other of said states.

17. A switch for control purposes, comprising:

a first source for producing electromagnetic radiation, a second source for producing electromagnetic radiation, a detector for detecting electromagnetic radiation, said first and second sources and said detector being located relative to each other and characterized such that in a given plane in front of and spaced from said first and second sources and from said detector, first and second areas exist such that when an object is located in said first area said detector detects predominantly reflected radiation from said first source and when an object is located in said second area, said detector detects predominantly reflected radiation from said second source, first means responsive to the output of said detector for producing a first output signal when an object is located in said first area, second means responsive to the output of said detector for producing a second output signal when an object is located in said second area, control means adapted to be placed in either of two states when actuated, said control means being characterized such that when it is placed in either of said two states, it remains in that state until actuated at which time it changes to the other of said states, first timing means adapted to be actuated by the onset of said first output signal, for producing a first timing signal having a predetermined time duration, said control means being actuated by the onset of said first timing signal, oscillator means for producing oscillator signals at a given frequency when actuated, said oscillator means being actuated by the onset of said second output signal, second timing means adapted to be actuated by each of said oscillator signals for producing a second timing signal each time it is actuated, each of said second timing signals having a predetermined time duration, said first timing means having an output coupled to said oscillator means for disabling said oscillator means when said first timing means is actuated, said second timing means having an output coupled to said first timing means for disabling said first timing means when said second timing means is actuated, load switch means adapted to be coupled to a supply of electrical energy and to a load for controlling the flow of electrical energy from said supply to said load, said control means being employed to control said load switch means for allowing the flow of electrical energy from said supply to said load when said control means is in one state and for terminating the flow of electrical energy from said supply to said load when said control means is in the other of said states, and means responsive to said oscillator signals for controlling said load switch means for causing said load switch means to vary the flow of electrical energy from said supply to said load in step with said oscillator signals when said control means is in said one state.

18. The switch of claim 5 wherein:

said circuit means comprises:

means responsive to the said output pulses for producing an output signal as long as the object is located in front of said source and detector within a predetermined distance therefrom, said timing means being responsive to said output signal for producing said timing signal, said output signal terminating when the object is moved to a position relative to said source and detector which is beyond said predetermined distance.

19. The switch of claim 14 wherein:

said means for periodically actuating said emitter for causing said emitter to emit bursts of infra-red radiation at said predetermined frequency comprises an oscillator for producing electrical pulses at said predetermined frequency for periodically actuating said emitter for causing said emitter to emit bursts of infra-red radiation at said predetermined frequency, said frequency discriminating means being responsive to said amplifier output pulses for producing said output signal only when said amplified output pulses are above said predetermined level, only when said amplified output pulses are produced at a frequency substantially the same as said predetermined frequency, and only when said output pulses are out of phase which said electrical pulses produced by said oscillator.

20. The switch of claims 2 or 4 wherein:

said means responsive to said oscillator signals for controlling said load switch means causes said load switch means to vary the flow of electrical energy from said supply to said load in step with said oscillator signals only when said control means is in said one state.

21. The switch of claim 12, comprising:

means coupled to the output of said control means and to said load switch means for controlling said load switch means for allowing the flow of electrical energy from said supply to said load when said control means is in said one state and for terminating the flow of electrical energy from said supply to said load when said control means is in said other state, said means coupled to the output of said control means and to said load switch means being coupled to said resistor means to allow the voltage sequentially applied across each of said resistor means to control said load switch means in step with said oscillator signals to sequentially allow different values of electrical energy from said supply to flow to said load only when said control means is in said one state.

22. The switch of claim 15, comprising:

means coupled to the output of said flip-flop and to said load switch means for controlling said load switch means for allowing the flow of electrical energy from said supply to said load when said flip-flop is in said one state and for terminating the flow of electrical energy from said supply to said load when said flip-flop is in said other state, said means coupled to the output of said flip-flop and to said load switch means being coupled to said resistor means to allow the voltage sequentially applied across each of said resistor means to control said load switch means in step with said oscillator signals to sequentially allow different values of electrical energy from said supply to flow to said load only when said flip-flop is in said one state.

23. The switch of claim 14 wherein:

said detector is located relative to said emitter for detecting bursts of infra-red radiation from said emitter reflected from a person's hand when placed in front of said emitter and detector at a position spaced therefrom, said detector producing output pulses upon detection of infra-red radiation bursts from said emitter reflected from a person's hand when placed in front of said emitter and detector, said amplified output pulses above said predetermined level being produced when a person's hand is located close to said emitter and detector, said timing signal having a time duration sufficient to allow one to remove one's hand away from said emitter and detector before said timing signal terminates.

24. The switch of claim 15, wherein:

said second detector is located relative to said second emitter for detecting bursts of infra-red radiation from said second emitter reflected from a person's hand when placed in front of said second emitter and said second detector at a position spaced therefrom, said second detector being characterized such that it produces output pulses upon detection of infra-red radiation bursts from said second emitter reflected from a person's hand when placed in front of said second emitter and said second detector at a position spaced therefrom.

25. The switch of claims 1, 2, 3, 4, 12, 14, or 15 wherein:

said load comprises an electric light bulb.

26. The switch of claims 1, 3 or 5, comprising:

means coupled from the output of said control means to said load switch means for controlling said load switch means for allowing the flow of electrical energy from said supply to said load when said control means is in said one state and for terminating the flow of electrical energy from said supply to said load when said control means is in said other state.

27. The switch of claim 14, comprising:

means coupled from the output of said flip-flop to said load switch means for controlling said load switch means for allowing the flow of electrical energy from said supply to said load when said flip-flop is in said one state and terminating the flow of electrical energy from said supply to said load when said flip-flop is in said other state.

* * * * *